United States Patent [19]

Siclari et al.

[11] Patent Number: 5,381,050
[45] Date of Patent: Jan. 10, 1995

[54] MULTI-POSITION ELECTRICAL CONNECTOR AND ELECTRICAL DEVICES INCORPORATING SAME

[75] Inventors: Scott R. Siclari, Lawrenceville; Munther A. Al-Khalil, Norcross, both of Ga.

[73] Assignee: Scientific Atlanta, Inc., Norcross, Ga.

[21] Appl. No.: 99,462

[22] Filed: Jul. 30, 1993

[51] Int. Cl.$^6$ .................................... H01R 29/00
[52] U.S. Cl. ..................................... 307/112; 439/221
[58] Field of Search ............... 439/685, 217, 218, 221, 439/78, 620; 307/112, 147

[56] References Cited

U.S. PATENT DOCUMENTS

| | | | |
|---|---|---|---|
| 2,922,054 | 1/1960 | Miller | 439/221 |
| 3,139,492 | 6/1964 | Cage, Jr. | 439/221 |
| 3,210,578 | 10/1965 | Sherer | 439/221 |
| 3,231,767 | 1/1966 | Powell | 439/221 |
| 3,697,932 | 10/1972 | Keto et al. | 439/221 |

Primary Examiner—Jeffrey A. Gaffin
Assistant Examiner—Peter Ganjoo
Attorney, Agent, or Firm—Banner, Birch, McKie & Beckett

[57] ABSTRACT

A plug and socket form a simple and compact electrical connector for selectively distributing an electrical signal along different paths. The plug and socket are symmetrically arranged so that they are engageable with each other in different positions to achieve different electrical connections. The electrical connector saves printed circuit board space, minimizes parts, and improves switching flexibility in an RF signal amplification device for amplifying an RF (e.g., CATV) signal transmitted along an RF cable, and in a power coupler for coupling an AC power signal into an RF cable.

24 Claims, 3 Drawing Sheets

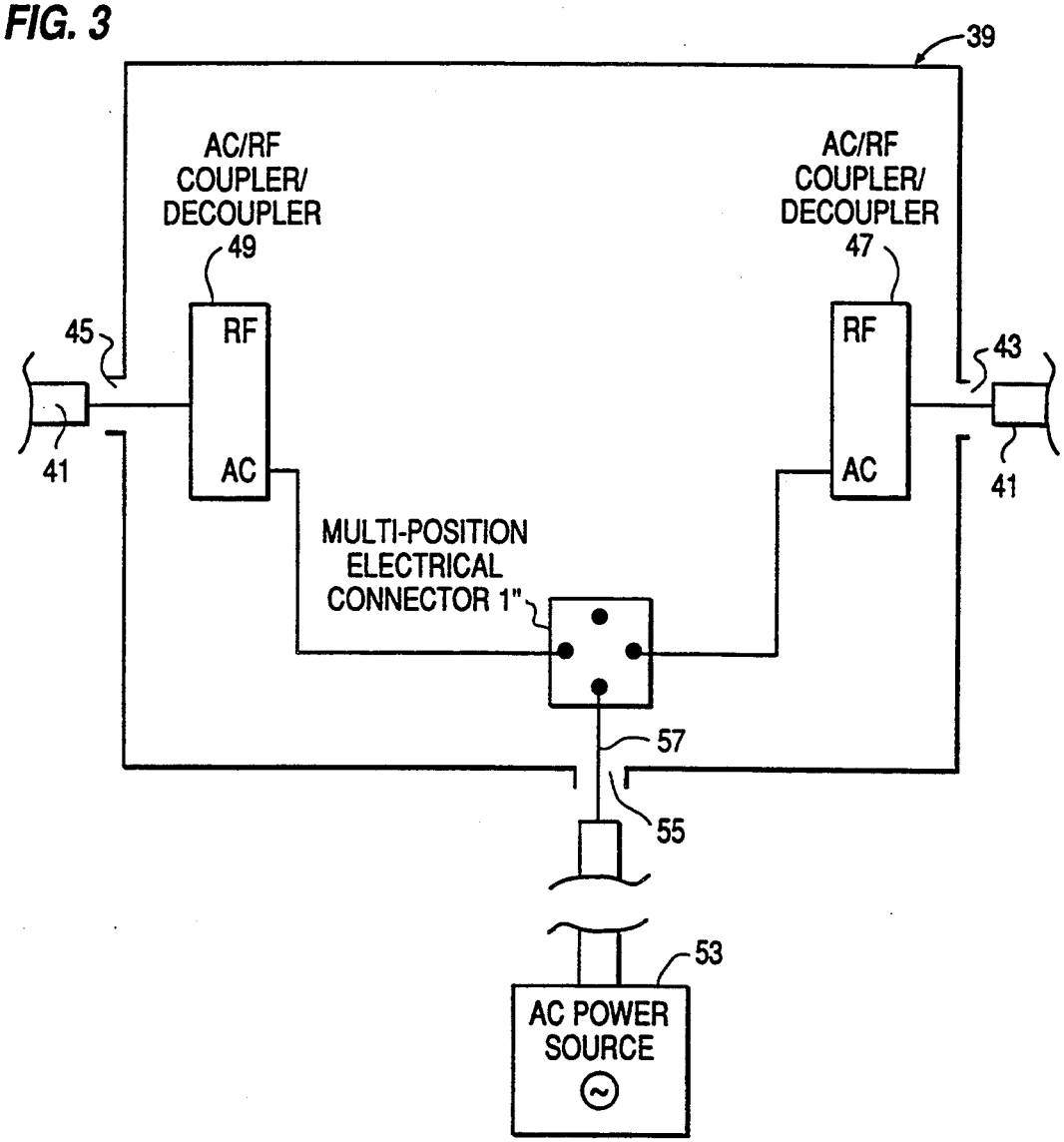

MULTI-POSITION ELECTRICAL CONNECTOR AND ELECTRICAL DEVICES INCORPORATING SAME

BACKGROUND OF THE INVENTION

The present invention relates to electrical connectors, and in particular to switchable electrical connectors. The present invention also relates to amplifying devices positioned along RF (e.g., CATV) cable, and power coupling equipment used to selectively distribute AC power to such devices over RF cable.

CATV signals are typically distributed from a centrally located station (headend) over long cables to a number of sub-stations (remote hubs), and then from the remote hubs through relatively short feeder lines to the individual receiving locations, e.g. residences. Most conventionally, the CATV signal is transmitted over coaxial cable as an RF signal.

The distribution of CATV signals as RF signals involves the positioning of various electrical signal amplifying devices (e.g., trunk amps, distribution amps and line extenders) along the CATV lines. These devices require electrical power to operate. For example, line extenders must be positioned along the lines at fixed intervals in order to compensate for line losses and thereby maintain proper signal strength. Typically, AC power is provided to line extenders and other amplifying devices positioned along the lines from an external source connected to the RF cable through an AC power coupler (power inserter). In this manner, each power source can power a number of amplifying devices along the line, and additional electrical lines for transmitting power to the devices are avoided. Within each line extender, the AC power signal is tapped and converted by an internal power supply to DC for application to the amplifying circuitry. In some applications, the AC power signal may be passed into the line extender through the RF input port. In other cases, the AC signal may enter through the RF output port. In either case, transmission of the AC power signal may be terminated at the line extender, or it may be desired to power another line extender or other equipment down the line by passing a portion of the signal back into the RF cable. Heretofore, a simple and compact arrangement has not existed for providing the aforementioned switching flexibility. A conventional arrangement requires a printed circuit board having two three-hole sockets, and two respective two pin plugs (a separate plug and socket arrangement associated with both the RF input and RF output). The two plugs are movable between block and pass positions defined by the sockets to accomplish the described switching A power inserter supplies AC power from an external AC power source, to the RF cable at selected locations. Depending on the particular application, it may be desirable to supply the AC power signal to devices positioned in one or both directions of the RF cable. Alternatively, in certain instances, it may be desirable to pass AC power through the power inserter, by-passing the AC power source. Heretofore, a simple and compact arrangement has not existed for providing such switching flexibility. A conventional arrangement places fuses in branched lines leading from the AC power source to each of two AC/RF couplers/decouplers in order to protect the amplifier circuitry from excessive currents from the AC power source. The fuses are removable to prevent AC power transmission in one or both directions of the RF cable. In addition to taking up excessive board space and requiring numerous components, this arrangement does not readily allow AC power to pass through the power inserter while the AC power source is by-passed.

SUMMARY OF THE INVENTION

In view of the foregoing, it is a principal object of the present invention to provide a simple and compact electrical connector capable of selectively distributing an electrical signal along a plurality of paths.

It is a more specific object of the invention to provide an RF signal amplifying device incorporating such an electrical connector, for selectively powering the amplifying device and passing an AC power signal back into the RF cable for powering other line devices.

It is yet another specific object of the present invention to provide a power coupler (inserter) with such an electrical connector, for selectively coupling an AC power signal into an RF cable, in either one or both line directions.

These and other objects are achieved by the present invention which comprises, in one aspect, a multi-position electrical connector. The connector has a first connector member comprising a conductor having a set of three symmetrically arranged contacts, rand a second connector member comprising a set of three symmetrically arranged lead terminals. The first and second connector members are arranged to be engageable with each other in at least three different relative positions such that the conductor selectively provides electrical continuity between: (a) all three lead terminals, (b) a first set of only two of the lead terminals, and (c) a second set of only two of the lead terminals.

In another aspect, the invention comprises a signal amplification device for amplifying an RF signal transmitted along an RF cable.

The amplification device has first and second RF cable ports. A first AC/RF coupler/decoupler is electrically connected to the first RF cable port, and has separate AC and RF terminals for (a) coupling separate AC power and RF signals fed to the AC and RF terminals and passing the composite signal to the first RF cable port, and (b) recoupling a composite AC/RF signal from the first cable port into separate AC and RF signals and providing the separate signals to the AC and RF terminals, respectively. A second AC/RF coupler/decoupler is electrically connected to the second RF cable port, and has separate AC and RF terminals for (a) coupling separate AC power and RF signals fed to the AC and RF terminals of the second coupler/decoupler and passing the composite signal to the second RF cable port, and (b) decoupling a combined AC/RF signal from the second cable port into separate AC and RF signals and providing signals to the AC and RF terminals of the second coupler/decoupler, respectively.

Bi-directional RF signal amplifier means are electrically connected between the RF terminals of the first and second AC/RF couplers/decouplers, for amplifying an RF signal carried by the RF cable. A DC power supply is provided for powering the amplifier means, and a multi-position electrical connector is provided for selectively providing AC power to the DC power supply, by connecting the power supply to either one or both of the AC terminals of the first and second couplers/decouplers.

The connector has a first connector member comprising a conductor having a set of three symmetrically arranged contacts, and a second connector member comprising a set of three symmetrically arranged lead terminals. The lead terminals are electrically connected, respectively, to the AC terminals of the first and second couplers/decouplers, and to the DC power supply. The first and second connector members are arranged to be engageable with each other in at least three different relative positions such that the conductor selectively provides electrical continuity between: (a) all three lead terminals, (b) only the two lead terminals connected to the DC power supply and the AC terminal of the first coupler/decoupler, and (c) only the two lead terminals connected to the DC power supply and the AC terminal of the second coupler/decoupler.

In a third aspect, the invention comprises a power coupling device for coupling an AC power signal into an RF cable.

The coupling device has first and second RF cable ports. A first AC/RF coupler/decoupler is electrically connected to the first cable port and has separate AC and RF terminals for (a) coupling separate AC power and RF signals fed to the AC and RF terminals and passing the composite signal to the first cable port; and (b) decoupling a composite AC/RF signal from the first cable port into separate AC and RF signals and providing the separate signals to the AC and RF terminals, respectively. A second AC/RF coupler/decoupler is electrically connected to the second cable port and has separate AC and RF terminals for (a) coupling separate AC power and RF signals fed to said AC and RF terminals of the second coupler/decoupler, and passing the composite signal to the second cable port; and (b) decoupling a composite AC/RF signal from the second cable port into separate AC and RF signals, and providing the separate signals to the AC and RF terminals of the second coupler/decoupler, respectively. The RF terminals of the first and second couplers/decouplers are in electrical contact with each other. An AC power cable port is provided for connection of an AC power source, and a multi-position electrical connector is provided for selectively providing AC power from the AC power source to the RF cable in one or both directions of the cable, by connecting the AC power source to either one or both of the AC terminals of the first and second couplers/decouplers.

The multi-position electrical connector comprises a first connector member comprising a conductor having a set of three symmetrically arranged contacts, and a second connector member comprising a set of three symmetrically arranged lead terminals. The lead terminals are electrically connected, respectively, to the AC terminals of the first and second couplers/decouplers, and the AC power cable port. The first and second connector members are arranged to be engageable with each other in at least three different relative positions such that the conductor selectively provides electrical continuity between: (a) all three lead terminals,(b) only the two lead terminals connected to the AC power cable port and the AC terminal of the first coupler/decoupler, and (c) only the two lead terminals connected to the AC power cable port and the AC terminal of the second coupler/decoupler.

The above and other objects and features of the invention will be readily apparent and fully understood from the following detailed description, taken in connection with the appended drawings.

BRIEF DESCRIPTION OF THE DRAWINGS

FIG. 3 is a schematic diagram of an inventive power coupling device incorporating an electrical connector of the type shown in FIG. 1.

DETAILED DESCRIPTION OF THE PREFERRED EMBODIMENTS

Figure 1:
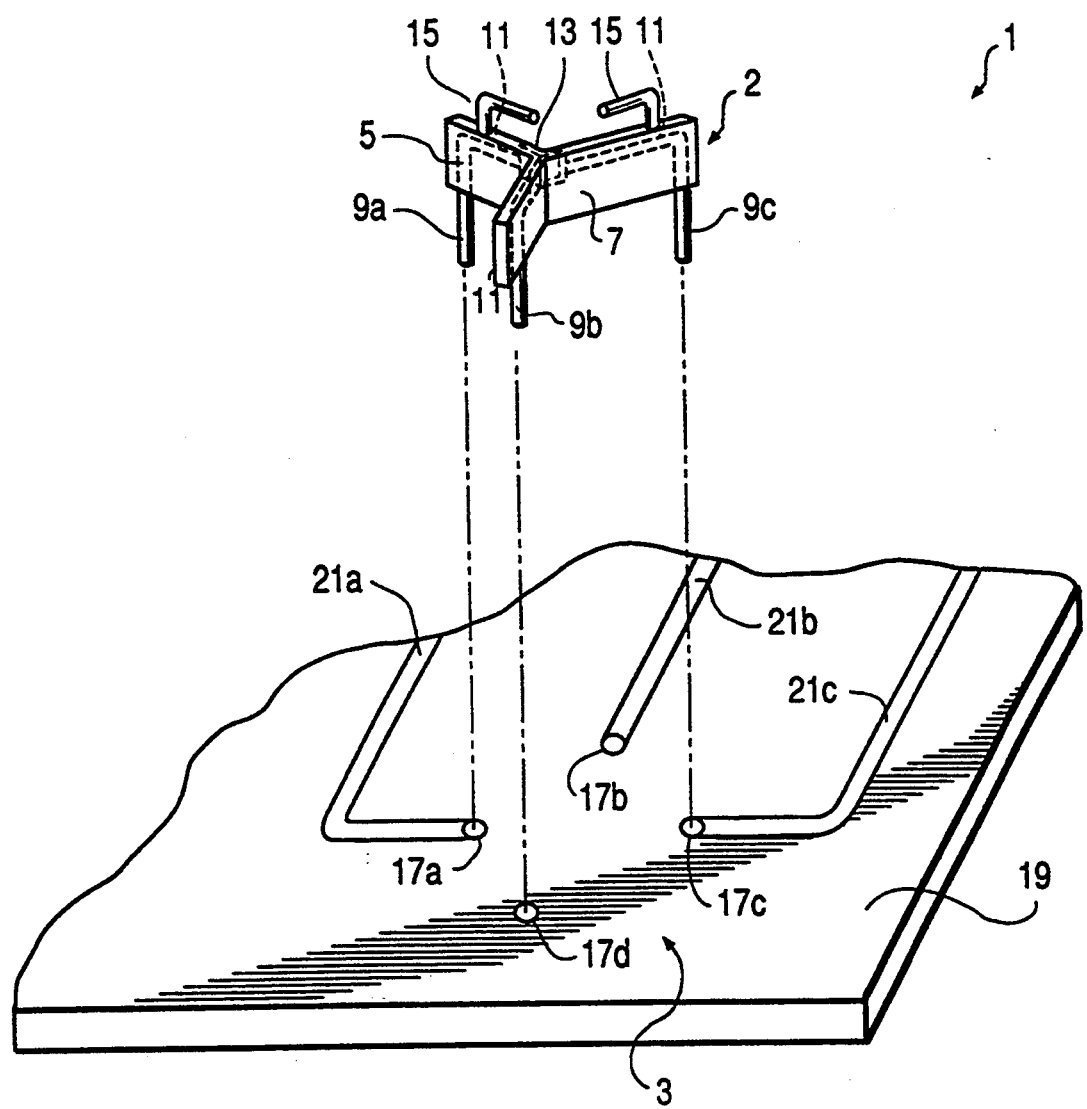
FIG. 1 is a perspective assembly view of a two piece electrical connector in accordance with the present invention.

Referring to FIG. 1, an electrical connector 1 in accordance with the present invention comprises a plug member 2 and corresponding socket 3. Plug 2 comprises a conductor 5 partially encapsulated by an insulating material, e.g., plastic, forming a plug body 7. Conductor 5 forms three symmetrically arranged pins 9a-c that protrude downwardly from plug body 7. Pins 9a-c are arranged to lie on an imaginary half circle at 90° intervals. Pins 9a-c are placed in electrical contact with each other by conductor arm portions 11 extending within insulating plug body 7. Plug 2 has an arrowhead-like shape with a single line of symmetry passing through pin 9b midway between pins 9a,c. In a preferred embodiment, a fused link 13 may be provided at the juncture of arms 11, whereby current flowing through connector 1 may be limited to a predetermined amount. Plug body 7 may have integrally molded therewith or otherwise attached a handle member 15 for facilitating hand grasping of plug 2.

Socket member 3 is preferably formed as a group of pin holes 17a-d formed in a printed circuit board 19. Holes 17a-d are symmetrically arranged to lie about an imaginary circle at 90° intervals thereby forming a star constellation-like configuration. The imaginary circles on which pins 9a-c and holes 17a-d lie are of equal size so that pins 9a-c may be engaged with any three adjacent ones of pin holes 17a-d.

The symmetrical arrangement of pins and pin holes allows plug 2 and socket 3 to be engaged with each other in four different relative positions. These different positions advantageously provide at least three different paths of electrical continuity (four paths in the FIG. 1 embodiment) with a minimum number of components (e.g., pins and sockets), and a minimum printed circuit board area. As show in FIG. 1, three pin holes 17a-c are provided as conductive sockets in electrical contact with conductive leads 21a-c. Remaining pin hole 17d may be non-conductive and electrically-isolated from leads 21a-c. With the arrangement and orientation as shown, pins 9a-c may be engaged with pin holes 17a,d,c to provide electrical continuity between leads 21a and 21c. By rotating plug 2 90° clockwise, engagement of pins 9a-c with pin holes 17a,b,d, will provide electrical continuity between leads 21a and 21b. A further 90° clockwise rotation will allow pins 9a-c to be engaged with pin holes 17a,b,c to provide electrical continuity between each of leads 21a-c. A final clockwise rotation of plug 90° will allow engagement of pins 9a-c with pin holes 17b,c,d to provide electrical continuity between leads 21b and 21c. Hence, four different paths of electrical continuity may readily be achieved. In an alternative embodiment to be described hereinafter, lead 21b extends also into electrical contact with pin hole 17d such that two positions of plug 2 provide electrical continuity between all three leads. In this alternative embodiment, a total of three different paths of electrical continuity are possible.

Obviously, plug 2 and socket 3 may be configured other than as shown. For example, plug 2 could have a V-shape requiting only two conductor arm portions 11 connecting pins 9a–c. Socket 3 could be formed as a discrete element formed separate from and then mounted on printed circuit board 19. A key feature is a symmetrical arrangement of switchable contacts for providing at least three alternative paths of electrical continuity with a minimum number of components.

Figure 2:
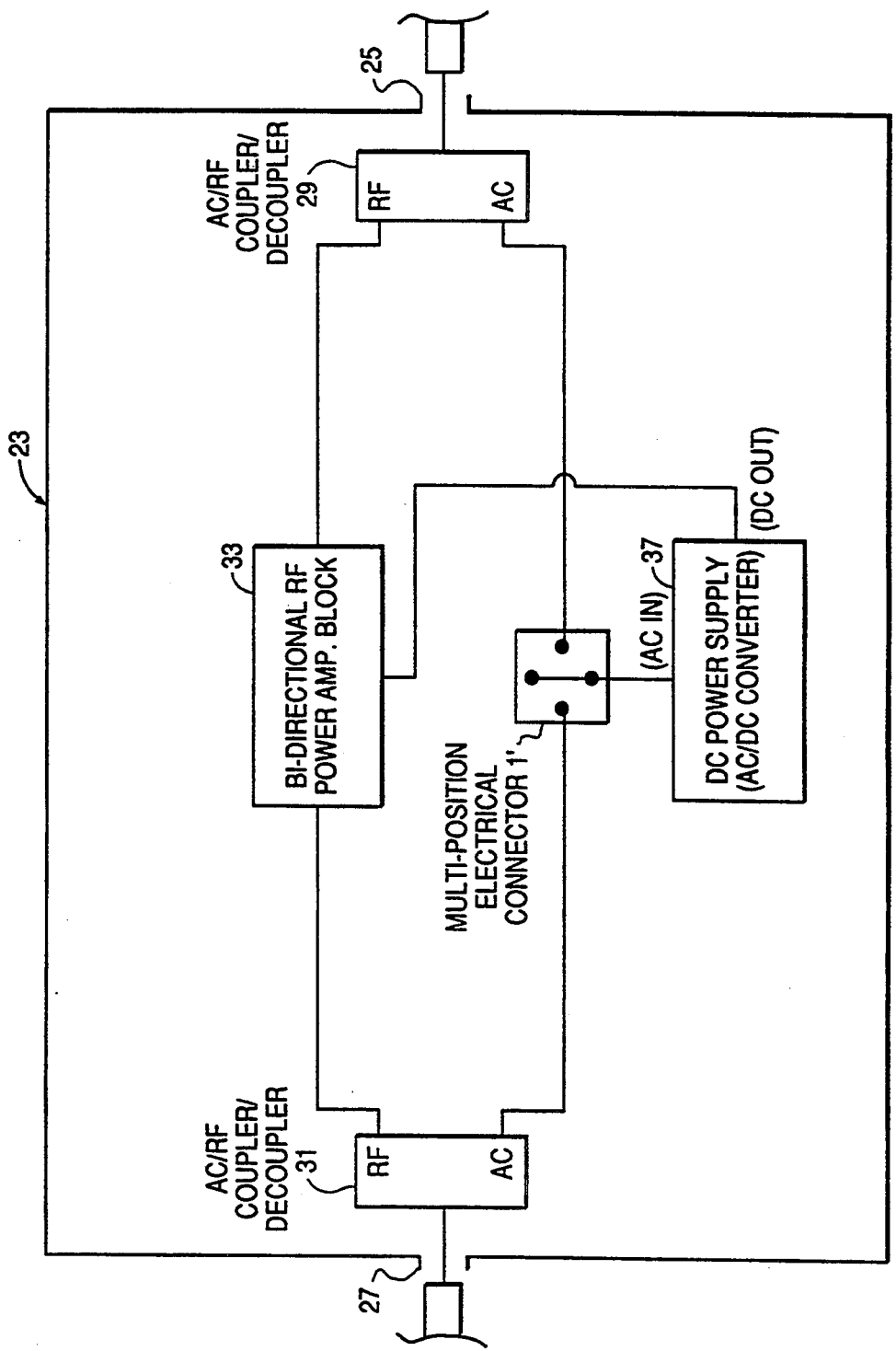
FIG. 2 is a schematic diagram of an inventive signal amplification device incorporating an electrical connector of the type shown in FIG. 1.

FIG. 2 shows a first practical application of electrical connector 1, in a signal amplifier 23 for amplifying an RF signal transmitted along an RF cable. Amplifier 23 (which may be a trunk amp, distribution amp, or line extender, such as for use in a CATV signal distribution network) has an RF cable input port 25 and an RF cable output port 27. Structurally identical input and output ports 25, 27 are connected, respectively, to identical AC/RF couplers/decouplers 29, 31. Such devices decouple (split) a composite AC/RF signal into separate AC and RF signals, and, conversely, couple (combine) separate RF and AC signals into a single composite signal. Such devices are well known and may comprise, for example, a diplex filter.

The RF signal emanates from the headend of the signal distribution system. The convention used herein is to describe the cable port on the side of the headend as the input port. (In practice, this may be either port.) The AC power signal may emanate in the same direction as the RF signal, or in an opposite direction depending upon the arrangement of AC power couplings (inserters) along the cable. Since both the AC power and RF signals are alternating currents, amplifier 23 is symmetrically arranged to decouple, amplify and couple signals from both sides in an identical fashion.

A composite AC/RF signal entering input port 25 is decoupled into separate AC and RF signals by coupler/decoupler 29. From the RF terminal thereof, the decoupled RF signal is input to a bi-directional RF power amp block 33 of known construction. The signal is amplified and past onto the RF terminal of coupler/decoupler 31 on the output side. The de, coupled AC power signal is converted to DC by power supply (AC to DC converter) 37 and used to power amplifier block 33. From the AC terminal of coupler/decoupler 29, the AC power signal is directed to a multi-position electrical connector 1' of the type shown in FIG. 1. Connector 1' allows the AC power signal to be selectively applied to DC power supply 37.

Unlike connector 1 shown in FIG. 1, connector 1' has the lead terminal extending to DC power supply 37 provided in electrical contact with conductive sockets of two pin holes. With this arrangement, when the plug is inserted such that the arrowhead shape of the plug points to the fight side of the drawing sheet, the AC power signal is provided only to DC power supply 37. With plug 2 pointing either upwardly or downwardly (relative to the drawing sheet), an AC power signal from the input side is supplied to DC power supply 37 and also passed onto the AC terminal of output side coupler/decoupler 31. Also, in this position any AC power signal emanating from the output side would be supplied to DC power supply 3 and passed onto the AC terminal of coupler/decoupler 29. Finally, with plug 1 inserted such that its arrowhead shape points to the left side, the AC terminal of output side coupler/decoupler 31 is placed in electrical contact with DC power supply 37. In this position, an AC power signal emanating from the output side would be provided to DC power supply 37, and would be blocked from further transmission along the cable.

The amplified RF signal from block 33 is applied to the RF terminal of coupler/decoupler 31, where it is combined with any AC signal passed onto the AC terminal of coupler/decoupler 31 by electrical coupling 1'. The composite AC/RF signal is then passed back into the cable through output port 27.

With the above-described arrangement, multi-position electrical connector 1' allows amplifier 23 to be powered by an AC power signal emanating from either the input or output side. Furthermore, amplifier 23 can readily be set to pass AC power upstream or downstream of the cable for powering other devices, or to block further transmission of the AC power signal.

Referring now to FIG. 3, shown is a power coupler (inserter) 39 for coupling an AC power signal into RF cable 41. Power coupler 39 has first and second cable ports 43 and 45, either one of which may be an "input" or "output" port. These ports are respectively connected to a pair AC/RF couplers/decouplers 47,49 of the type describe in connection with amplifier 23. The RF terminals of couplers/decouplers 47, 49 are directly electrically connected to each other. The AC terminals of each coupler/decoupler lead to respective conductive sockets of a multi-position electrical connector 1" of the type illustrated in FIG. 1. In this embodiment, multi-position electrical connector 1" selectively connects an external AC power source 53 to one or both of the AC terminals of couplers/decouplers 47, 49. External power source 53 is electrically connected to coupling 1" via a cattle attached at AC power cable port 55, and a lead 57 running from cable port 55 to a conductive socket of connector 1".

As will be apparent, when plug 2 engages with socket 3 such that the plug's arrowhead shape points to the fight side, AC power source 53 will supply an AC power signal to only the AC terminal of coupler/decoupler 47. At this point, the power signal is coupled with the RF signal passing between couplers/decouplers 47, 49, and the composite signal is passed into cable 41. This allows amplifiers and other line devices toward the headend to be powered, while blocking AC power from flowing in the downstream direction. On the other hand, by inserting plug 2 into socket 3 such that plug 2 points toward the left side power transmission is obtained only in the downstream direction. By inserting plug 2 into socket 3 such that plug 2 points downwardly, an AC power signal from power source 53 may be transmitted in both directions of cable 41. Finally, since a remaining hole of multi-position electrical coupling 1" is electrically isolated from the other three leads, if plug 1 is inserted into socket 3 such that plug 2 points upwardly, external AC power source 53 is bypassed, and an AC power signal in line 41 may simply pass through power coupling device 39.

The invention has been described in terms of presently preferred embodiments thereof. Numerous other embodiments and modifications within the scope and spirit of the invention as defined in the appended claims will occur to those having ordinary skill in the art.

We claim:

1. A multi-position electrical connector, comprising:
   a first connector member having only one conductor,
      said conductor having only three electrical contacts, said contacts being symmetrically arranged with respect to each other; and a second connector member comprising a set of three symmetrically arranged lead terminals; said first and second connector members being arranged to be engageable with each other in three different relative positions such that said conductor selectively provides three direct paths of electrical continuity between:

(a) all three said lead terminals;
(b) a first set of only two said lead terminals; and
(c) a second set of only two said lead terminals:

wherein said second connector member comprises four engagement locations for selectively engaging said three electrical contacts, and said three direct paths of electrical continuity are attainable by selectively engaging said three contacts with said second connector member at said four engagement locations.

2. An electrical connector according to claim 1, wherein said first and second connector members are engageable in a fourth relative position such that said conductor selectively provides electrical continuity between a third set of only two said lead terminals.

3. An electrical connector according to claim 1, wherein said first connector member forms a plug comprising an insulating body encasing part of said conductor, said three contacts are provided as three pins protruding from said insulating body, and said second connector member comprises a socket member having four pin holes for selectively engaging the three pins of said plug.

4. An electrical connector according to claim 3, wherein said three lead terminals are, respectively, provided in electrical contact with conductive sockets of three of said four pin holes.

5. An electrical connector according to claim 4, wherein the remaining pin hole is electrically isolated from said three lead terminals.

6. An electrical connector according to claim 4, wherein one of said lead terminals is also provided in electrical contact with a conductive socket of the remaining pin hole.

7. An electrical connector according to claim 3, wherein said socket member is formed as part of a printed circuit board.

8. An electrical connector according to claim 3, wherein said four pin holes are arranged to lie on an imaginary circle at 90° intervals, and said three pins lie at 90° intervals on an imaginary half circle of equal size, whereby said different relative positions are obtained by rotating the plug and socket member with respect to each other before engaging the same.

9. An electrical connector according to claim 3, wherein said conductor comprises a fused link for limiting the current flowable through said connector.

10. A signal amplification device for amplifying an RF signal transmitted along an RF cable, comprising:

first and second RF cable ports;

a first AC/RF coupler/decoupler electrically connected to said first RF cable port, and having separate AC and RF terminals, for (a) coupling separate AC power and RF signals fed to said AC and RF terminals and passing a composite signal to said first RF cable port; and (b) decoupling a composite AC/RF signal from said first cable port into separate AC and RF signals and providing the decoupled signals to said AC and RF terminals, respectively;

a second AC/RF coupler/decoupler electrically connected to said second RF cable port, and having separate AC and RF terminals, for (a) coupling separate AC power and RF signals fed to said AC and RF terminals of the second coupler/decoupler and passing a composite signal to said second RF cable port; and (b) decoupling a composite AC/RF signal from said second cable port into separate AC and RF signals and providing the decoupled signals to the AC and RF terminals of the second coupler/decoupler, respectively;

bi-directional RF signal amplifier means electrically connected between the RF terminals of said first and second AC/RF couplers/decouplers, for amplifying an RF signal carried by the RF cable;

a DC power supply for powering said amplifier means; and a multi-position electrical connector for selectively providing AC power to said DC power supply by connecting said power supply to either one or both of the AC terminals of said first and second couplers/decouplers, said electrical connector comprising:

a first connector member having only one conductor, said conductor having only three electrical contacts, said contacts being symmetrically arranged with respect to each other; and a second connector member comprising a set of three symmetrically arranged lead terminals, said lead terminals being electrically connected, respectively, to said AC terminals of the first and second couplers/decouplers, and said DC power supply;

said first and second connector members being arranged to be engageable with each other in three different relative positions such that said conductor selectively provides three direct paths of electrical continuity between:

(a) all three said lead terminals;
(b) only the two lead terminals connected to said DC power supply and said AC terminal of the first coupler/decoupler; and
(c) only the two lead terminals connected to said DC power supply and said AC terminal of the second coupler/decoupler;

wherein said second connector member comprises four engagement locations for selectively engaging said three electrical contacts, and said three direct paths of electrical continuity are attainable by selectively engaging said three contacts with said second connector member at said four engagement locations.

11. An RF signal amplification device according to claim 10, wherein said first connector member forms a plug comprising an insulating body encasing part of said conductor, said three contacts are provided as three pins protruding from said insulating body, and said second connector member comprises a socket member having four pin holes for selectively engaging the three pins of said plug.

12. An RF signal amplification device according to claim 11, wherein said three lead terminals are, respectively, provided in electrical contact with conductive sockets of three of said four pin holes.

13. An RF signal amplification device according to claim 12, wherein one of said lead terminals is also provided in electrical contact with a conductive socket of the remaining pin hole.

14. An RF signal amplification device according to claim 11, wherein said socket member is formed as part of a printed circuit board.

15. An RF signal amplification device according to claim 11, wherein said four pin holes are arranged to lie on an imaginary circle at 90° intervals, and said three pins lie at 90° intervals on an imaginary half circle of equal size, whereby said different relative positions are obtained by rotating the plug and socket member with respect to each other before engaging the same.

16. An RF signal amplification device according to claim 11, wherein said conductor comprises a fused link for limiting the current flowable through said coupling.

17. A power coupling device for coupling an AC power signal into an RF cable, comprising:

first and second RF cable ports;

a first AC/RF coupler/decoupler electrically connected to said first cable port and having separate AC and RF terminals for (a) coupling separate AC power and RF signals fed to said AC and RF terminals and passing the composite signal to said first cable port; and (b) decoupling a composite AC/RF signal from said first cable port into separate AC and RF signals and providing the decoupled signals to said AC and RF terminals, respectively;

a second AC/RF coupler/decoupler electrically connected to said second cable port and having separate AC and RF terminals for (a) coupling separate AC power and RF signals fed to said AC and RF terminals of the second coupler/decoupler and passing the composite signal to said second cable port; and (b) decoupling a composite AC/RF signal from said second cable port into separate AC and RF signals and providing the decoupled signals to said AC and RF terminals of the second coupler/decoupler, respectively; said RF terminals of the first and second couplers/decouplers being in electrical contact;

an AC power cable port for connection of an AC power source; and a multi-position electrical connector for selectively providing AC power from said AC power source to said RF cable in either direction of the cable, by connecting said AC power source to either one or both of the AC terminals of said first and second couplers/decouplers, said electrical connector comprising:

a first connector member having only one conductor, said conductor having only three electrical contacts, said contacts being symmetrically arranged with respect to each other; and a second connector member comprising a set of three symmetrically arranged lead terminals, said lead terminals being electrically connected, respectively, to said AC terminals of the first and second couplers/decouplers, and said AC power cable port;

said first and second connector members being arranged to be engageable with each other in three different relative positions such that said conductor selectively provides three direct paths of electrical continuity between:

(a) all three said lead terminals;
(b) only the two lead terminals connected to the AC power cable port and the AC terminal of the first coupler/decoupler; and
(c) only the two lead terminals connected to the AC power cable port and the AC terminal of the second coupler/decoupler;

wherein said second connector member comprises four engagement locations for selectively engaging said three electrical contacts, and said three direct paths of electrical continuity are attainable by selectively engaging said three contacts with said second connector member at said four engagement locations.

18. A power coupling device according to claim 17, wherein said first and second connector members are engageable in a fourth relative position such that said conductor selectively provides electrical continuity between only the two lead terminals connected to said AC terminals of the first and second splitters/conductors, whereby AC power is allowed to flow through the coupling device and the AC power source is by-passed.

19. A power coupling device according to claim 17, wherein said first connector member forms a plug comprising an insulating body encasing part of said conductor, said three contacts are provided as three pins protruding from said insulating body, and said second connector member comprises a socket member having four pin holes for selectively engaging the three pins of said plug.

20. A power coupling device according to claim 19, wherein said three lead terminals are, respectively, provided in electrical contact with conductive sockets of three of said four pin holes.

21. A power coupling device according to claim 20, wherein the remaining pin hole is electrically isolated from said three lead terminals.

22. A power coupling device according to claim 19, wherein said socket member is formed as part of a printed circuit board.

23. A power coupling device according to claim 19, wherein said four pin holes are arranged to lie on an imaginary circle at 90° intervals, and said three pins lie at 90° intervals on an imaginary half circle of equal size, whereby said different relative positions are obtained by rotating the plug and socket member with respect to each other before engaging the same.

24. A power coupling device according to claim 19, wherein said conductor comprises a fused link for limiting the current flowable through said coupling.

* * * * *